United States Patent [19]

Lindmayer

[11] Patent Number: 4,864,536
[45] Date of Patent: Sep. 5, 1989

[54] OPTICAL MEMORY SYSTEM AND METHOD OF USING THE SAME

[75] Inventor: Joseph Lindmayer, Potomac, Md.
[73] Assignee: Quantex Corporation, Rockville, Md.
[21] Appl. No.: 870,877
[22] Filed: Jun. 5, 1986
[51] Int. Cl.[4] .................. G11C 13/00; G11C 8/00; H01J 1/62; H01J 63/04
[52] U.S. Cl. .................. 365/119; 365/106; 365/111; 365/230.01; 313/486
[58] Field of Search .............. 365/106, 111, 112, 127, 365/147, 151, 152, 153, 128, 119, 230.01; 313/486

[56] References Cited

U.S. PATENT DOCUMENTS

| | | | |
|---|---|---|---|
| 2,521,124 | 9/1950 | Miller | 252/301.4 |
| 2,522,074 | 9/1950 | Urbach | 252/301.4 |
| 2,527,365 | 10/1950 | Leverenz | 252/301.4 |
| 2,742,631 | 4/1956 | Rajchman et al. | 365/106 |
| 2,979,467 | 4/1961 | Keller | 252/301.4 |
| 3,767,588 | 10/1973 | Otomo et al. | 252/301.4 H |
| 4,064,066 | 12/1977 | Toshinai et al. | 252/301.6 R |
| 4,113,353 | 12/1978 | Matsushita | 350/171 |
| 4,170,475 | 10/1979 | Kuehnle | 365/112 |
| 4,549,083 | 10/1985 | Ozawa | 250/484.1 |
| 4,704,635 | 11/1987 | Nudelman | 313/366 |

OTHER PUBLICATIONS

R. A. Soref, "Optical Memory Characteristics of a SrS (Eu, Sm) Phosphor", *Proceedings of the IEEE*, pp. 425-426 (Mar. 1966).
C. S. Duggan et al., "Optical Dynamic Disk Storage Device", *IBM Technical Disclosure Bulletin*, vol. 23, No. 5 (Oct. 1980), pp. 2040-2043.
J. Naito et al., "Phosphor Disk Bit Storage", *Transactions of the IECE of Japan*, vol. E59, No. 10, (Oct. 1976).
Keller et al., "Physical Review", vol. 108, No. 3, 11/1/57, "Studies on Some Infrared Stimulable Phosphors", pp. 663-676.
Lindmayer, "Infrared Phosphors as Sensors", Sensors, Mar. 1986.
Forrest M. Mims, "How to See Near Infrared Radiation", Modern Electronics, May 1986.
PCT, Kabay et al., "Infrared Sensitive Phosphor and Method of Preparing the Same".

Primary Examiner—Stuart N. Hecker
Assistant Examiner—Melissa J. Koval
Attorney, Agent, or Firm—Ostrolenk, Faber, Gerb & Soffen

[57] ABSTRACT

An optical memory system and associated method uses electron trapping materials. Data may be written into an optical memory made of the electron trapping material by application of a visible light source to the material. The visible light source causes electrons to be trapped in the material, which electrons will be released and emit visible light upon application of a read beam infrared source to the material. An arrangement realizes logical functions by parallel memories each memory having stripes of memory material disposed upon a plastic substrate.

36 Claims, 4 Drawing Sheets

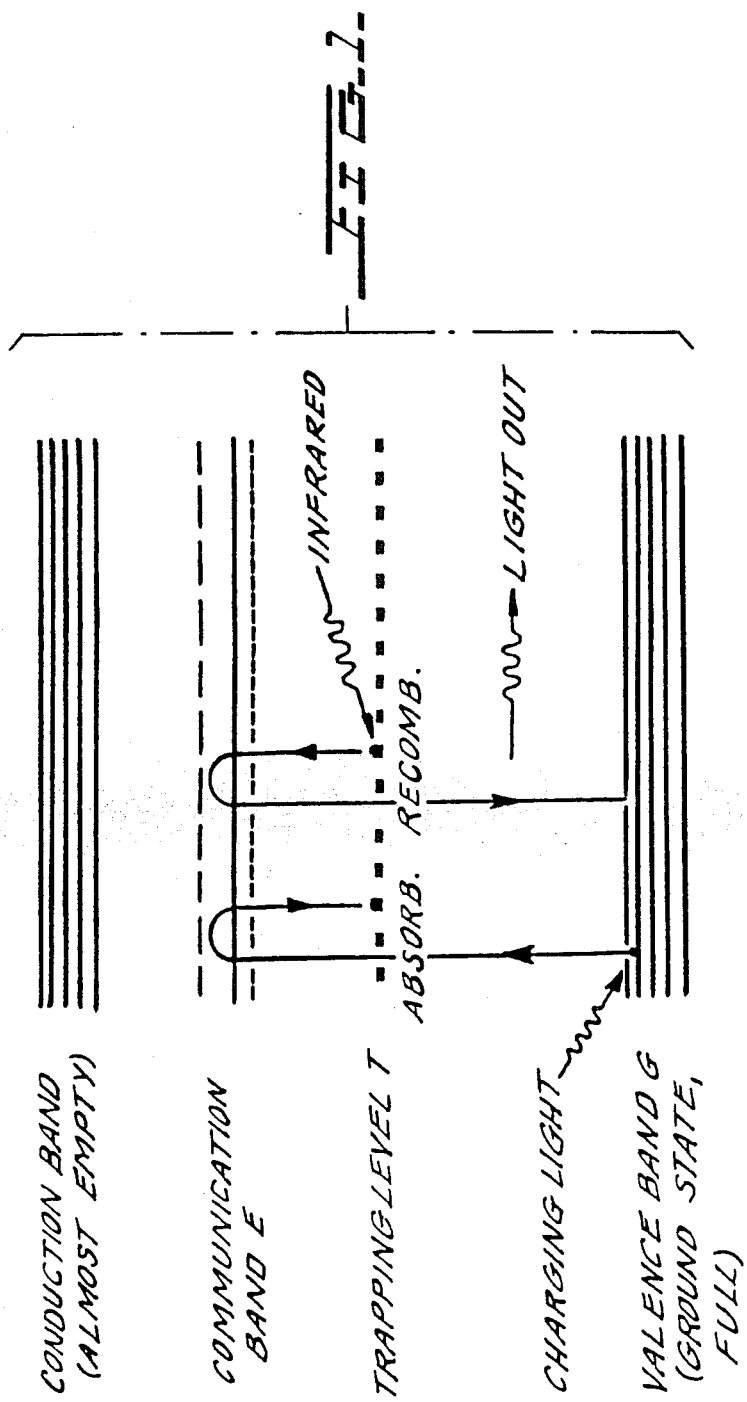

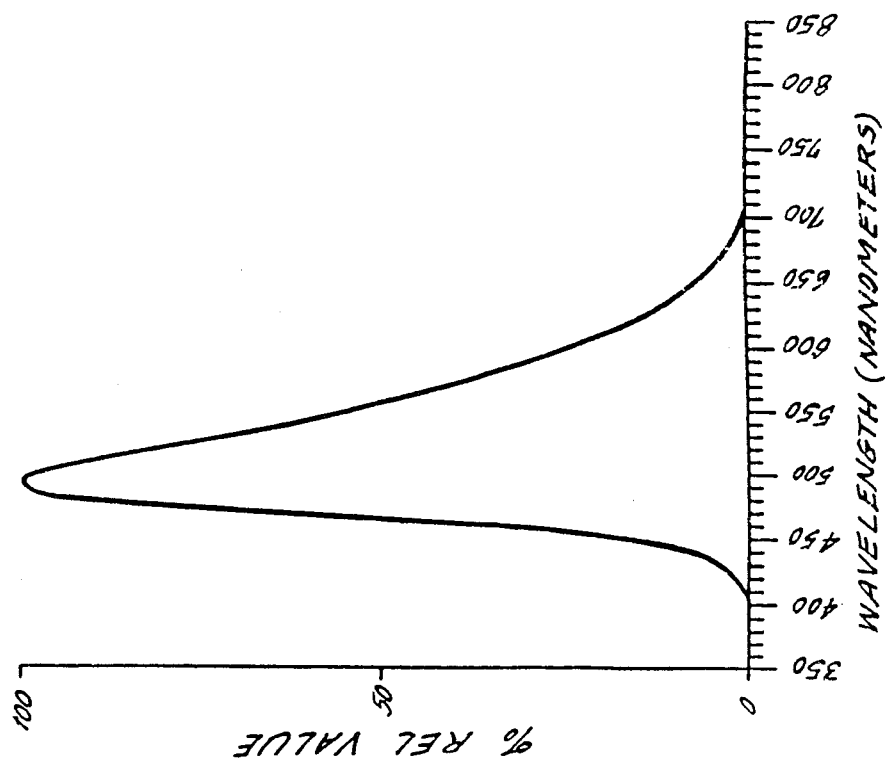
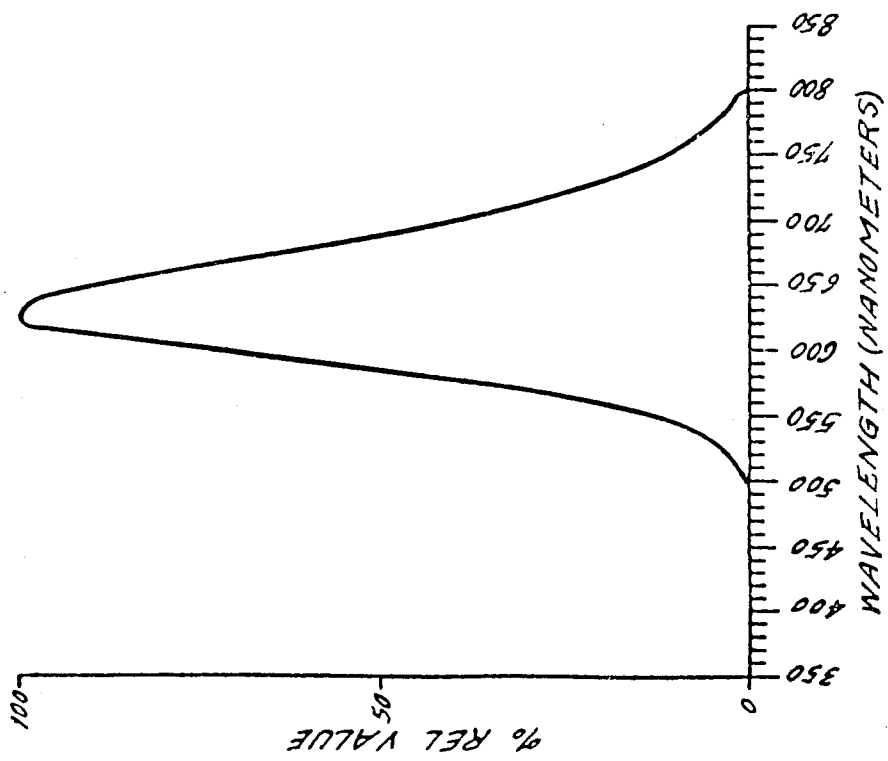

OPTICAL MEMORY SYSTEM AND METHOD OF USING THE SAME

CROSS REFERENCE TO RELATED APPLICATION

This application is a continuation-in-part of U.S. patent application Ser. No. 786,095 filed Oct. 10, 1985.

This application uses materials and processes disclosed and claimed in the present inventor's U.S. patent application Ser. No. 870,809, now U.S. Pat. No. 4,830,875 entitled "PHOTOLUMINESCENT MATERIALS AND ASSOCIATED PROCESS AND INFRARED SENSING DEVICE", filed concurrently herewith and hereby incorporated by reference.

BACKGROUND OF THE INVENTION

This invention relates to optical memory methods and systems. More specifically, this invention relates to the use of electron trapping materials in such methods and systems.

Optical techniques for information storage permit rugged, removable media to carry 10 to 20 times more data per platter than the best available fixed inductive magnetic media and 100 times more than the best removable media. After years of research and development, optical memory drives and media have recently begun commercialization. These optical memories have generally been based upon laser video disc technology, a particular type of read-only memory.

As used herein, an "optical memory" is a memory wherein the value of data is read depending on "optical energy" (defined herein as visible light, infrared, or ultraviolet radiation) from the memory.

Although the analog read-only video disc systems have been generally useful, such systems have been subject to several disadvantages. Specifically, these systems rely upon a pattern etched within the laser disc and are not generally subject to reprogramming. The initial "programming" of the laser disc requires a generally high power laser source to "burn" the pattern into the disc, although additional copies may be made by photolithography.

Various optical memory developments are described in "SPECIAL REPORT: THE OPTIONS MULTIPLY IN MASS STORAGE" beginning at Page 28 of the May 19, 1986 Electronics, copyright 1986, McGraw-Hill, Inc., which magazine article is hereby incorporated by references.

Among current optical memory proposals and non-optical memory designs numerous disadvantages such as high access time, costly construction materials, low density of storage, low speed of programming and/or access, high error rates, lack of erasability, and high power requirements are common. Additionally, some known memory systems require a "refresh" step upon access of the memory or every so often to avoid having the memory lose data. That is, the data is lost from the memory upon access or over time such that "refresh" methods and techniques must be used. A further disadvantage of numerous prior memory systems is that they are volatile in that they lose their data upon a loss of power.

OBJECTS AND SUMMARY OF THE INVENTION

A primary object of the invention is to provide an optical memory method and system which avoids or minimizes the disadvantages discussed above.

A more specific object of the present invention is to provide a new and improved optical memory method and system based upon use of an electron trapping material sensitive enough to be marked at high data rates with low power sources and operable to maintain data almost error free and be erasable.

A further object of the present invention is to provide an optical memory method and system which allows data to be stored in very high density.

Yet another object is to provide a memory system which is conveniently accessible in parallel and provides great freedom in its design architecture.

The above and other objects of the present invention which will become more apparent as the description proceeds are realized by a method comprising the steps of: writing at a location in an optical read-write electron trapping first memory by addressing the location, and applying write optical energy to the location to input data by trapping of electrons therein; and reading at the location by addressing the location, applying read optical energy to the location to cause photon emission from the release of trapped electrons; and sensing emitting optical energy corresponding to the photon emission. Data is erased from the location by applying erase optical energy to the location. The write optical energy has a different wavelength from the read optical energy. The erase optical energy is of a higher power and the same wavelength as the read optical energy. The write optical energy is visible light, the read optical energy is infrared and the emitted optical energy is visible light. The write optical energy is applied by a laser. The read optical energy is applied by a laser from a first side of the first memory and the emitted optical energy is sensed from a second side of the first memory, opposite the first side. A plurality of data bits may be simultaneously written into said first memory. The memories have a memory medium which comprises: a base material selected from the group of alkaline earth metal sulfides and selenides; and from 50 to 300 parts per million of samarium. The memory medium further comprises: a europium compound selected from the group of: europium oxide, europium floride, europium chloride, and europium sulfide, there being from 300 to 800 parts per million of the europium compound. Alternately, the memory medium further comprises: from 300 to 1500 parts per million of cerium oxide, and wherein there is from 50 to 200 parts per million of samarium in the memory medium. The memory medium further comprises: from 1% to 5% barium sulfate by weight.

The invention may alternately be expressed as comprising: an optical read-write electron trapping first memory; an addresser for selecting storage locations in the first memory; a first source of optical energy for applying write optical energy at a storage location determined by the addresser; and a sensor for sensing optical energy emitted corresponding to the release of trapped electrons from the first memory. An address register is connected to supply the addresser with a selected address. The first source is mounted upon a head movable relative to the first memory. Alternately, the addresser is a deflector operable to direct a beam of optical energy from the first source to different storage locations on the first memory. A second source of optical energy is used for applying read and erase optical energy to the first memory. The first source is a visible light laser and the second source is an infrared laser. The first source and the sensor are at opposite sides of the memory. The invention further comprises an optical read-write electron trapping second memory disposed for simultaneous application of optical energy to the first and second memories such that a sensor depends upon a logical function of data in the first and second memories. The memory medium comprises the materials identified above.

The invention alternately may be described as the electron trapping memory materials described above when mounted to a substrate of aluminum oxide to form an addressable optical memory tape, disc, or other memory suitable format.

BRIEF DESCRIPTION OF THE DRAWINGS

The above and other features of the present invention will become more apparent as the description proceeds when taken in conjunction with the accompanying drawings wherein like characters represent like parts throughout the several views and in which:

FIG. 1 shows the principle of operation of the memory of the present invention.

FIG. 2 shows a frequency spectrum of the output of a particular memory medium of the present invention.

FIG. 3 shows a frequency spectrum of the output of an alternate memory material of the present invention.

DETAILED DESCRIPTION

Figure 4:
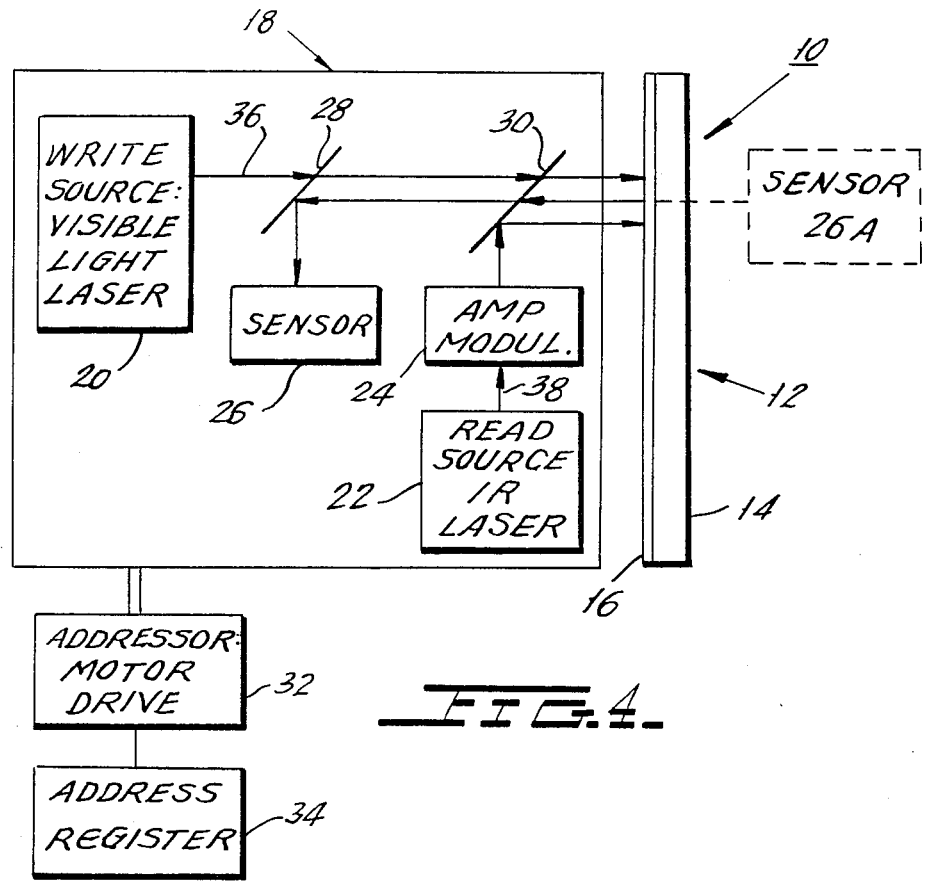
FIG. 4 shows a schematic of a first memory arrangement according to the present invention.

The memory system and method of the present invention are based upon the use of electron trapping materials. Such materials produce free electrons upon application of light or other energizing agents. (As used herein, the term "light" shall include infrared light, visible light, and ultraviolet light.) Upon removal of the energizing agent such as optical energy, the free electrons may be trapped at an energy level higher than their ground state. If the depth of the trap (that is, the amount of energy required to release the electron from the trap) is large and the temperature is low, the electron will remain trapped for a long time. Indeed, if the depth of the electron trapped is sufficiently great, the electron will remain trapped almost indefinitely in the absence of application of external energy such as thermal energy and/or further optical energy.

As shown in FIG. 1, the electron on the left is originally is in a valence band G and is energized by application of a visible charging light to a communication band E. Upon removal of the charging light, the electron will drop back to a trapping level T. The electron will remain trapped in the trapping level until sufficient additional energy is provided to the electron to move it back up to the communication band E. As shown on the right side of FIG. 1, the electron may be stimulated by infrared optical energy to move it back up to the communication band E for recombination whereupon it may move back down to the valance band G and output visible light in the process. The present invention works upon the principle illustrated in FIG. 1 whereby light may be "stored" by the phenomenon of electron trapping and the light may be freed by application of infrared radiation to push the electron up above the trap and allow it to return to the valence band.

Before discussing the specific memory systems and methods of the present invention, it will be useful to discuss several preferred embodiments of materials which provide the necessary optical sensitivity to realize the memory systems and methods of the present invention. The materials which may be used in the present invention are discussed in detail in the above listed incorporated by reference application.

EXAMPLE 1

A memory media material is made from a mixture having the following composition:

| | |
|---|---|
| Strontium sulfide | 100 parts |
| Barium sulfate | 5.5 parts |
| Lithium fluoride | 5.5 parts |
| Samarium | 150 parts per million |
| Europium oxide | 550 parts per million |

As used above and throughout this application, "parts" and "parts per million" shall refer to parts by weight unless otherwise noted.

The mixture is placed into a graphite crucible within a furnace flushed with a dry nitrogen atmosphere (or other dry inert gas) and heated to between 1150 degress or 1300 degrees centigrade (preferably 1150 degrees) for 45 minutes to 1 hour such that it forms a fused mass.

After cooling the fused mass is ground into a fine powder particle size of 1 to 10 microns.

After grinding, the powdered material is heated to about 300 to 700 degrees centigrade (preferably 600 degrees) in the graphite crucible within the nitrogen atmosphere furnace. This second heating is below the fusing temperature of the material and is maintained for 10 to 60 minutes (preferably 30 minutes). This second heating provides repair to the crystalline surfaces of the powdered material resulting from the earlier steps.

After the second heating, the material is cooled and the powdered material is then mixed with a suitable binder or vehicle.

After the powdered material has been mixed with a transparent binder, it is applied as a thin coating to a clear plastic substrate in order to realize a memory device according to the present invention. The coating of memory material upon the clear plastic substrate will preferably be between 1 micron and 20 microns thick.

In the above mixture, the strontium sulfide serves as a base material, whereas the lithium floride is used to provide the fusability characteristic useful for the specific preferred embodiment. Alternately, other alkaline earth metal sulfides and selenides might be used as the base material.

The optional barium sulfate in the above mixture is used to improve the brightness of output light from the memory material. Preferably 5.5 parts are used as noted above, but between 2 and 10 parts may be used of the barium sulfate as well as between 2 and 10 parts of lithium floride relative to the 100 parts of strontium sulfide.

The samarium and europium oxide in the above mixture are used for establishing the electron trap. Preferably, 150 parts per million of samarium are used, but the samarium could alternately be between 50 parts per million and 300 parts per million. The europium oxide will preferably be between 300 and 800 parts per million and between 400 and 600 parts per million are most preferred with 550 parts per million being the optimal value. Europium floride, europium chloride, or europium sulfide could be used in lieu of europium oxide.

The mixture resulting from the above process provides a depth for electron traps of 1.2 electron-volts and has an output spectrum as shown by FIG. 2 illustrating the center frequency of the output at approximately 620 nanometers.

The memory material of the above composition will provide an orange output light and will be operable for storing visible light in the sense that visible light may be used to trap electrons within the material. Upon "reading" the material by applying infrared light to the material, trapped electrons will be freed, thereby releasing the visible light. Accordingly, the material may serve as a optical memory whereby one may store information by applying visible light and read the information by application of infrared light.

More details as to the processes, ranges, and portions for each of the examples herein are explained in the incorporated by reference application.

EXAMPLE 2

A second preferred mixture for use with the present invention has the following composition:

| | |
|---|---|
| Strontium sulfide | 100 parts |
| Barium sulfate | 5 parts |
| Lithium fluoride | 10 parts |
| Samarium | 100 parts per million |
| Cerium oxide | 1200 parts per million |

The above mixture is processed in the same fashion as Example 1 by first heating it to fusing, grinding the resulting fused mass, and then reheating at below the fusing temperature but sufficiently high to allow repair of damage to the crystalline parts. The same process steps in terms of temperature and time intervals may be used in processing this second material. The resulting powder may be used with the particles combined with a transparent binder or vehicle and applied to a plastic substrate to realize a memory material which provides electron trapping at a trap level of 1.2 electron volts.

In the above mixture the barium sulfate may vary between 2 and 10 parts, the lithium floride may vary between 2 and 10 parts, the samarium may vary between 50 and 200 parts per million, and the cerium oxide may vary between 300 and 1500 parts per million. However, the specific values for portions which are given above provide highly optimal characteristics.

The above materials will provide the electron trapping features required for the present memory systems and methods. The first material may be charged up very quickly with visible light having a charging wavelength of 600 nanometers or less. This material holds the charge for very long times, possibly years. In order to trigger re-emission of visible light, an infrared source in the range of 800–1200 nanometers is required. The output visible light will be centered around 620 nanometers (orange) with the spectrum of FIG. 2.

The second material may be charged up very quickly with visible light and will hold the charge for extended periods of time similar to the first material. It will trigger re-emission of visible light upon application of an infrared source. The emission is centered at about 500 nanometers, a blue-green visible light. The material may hold the charge for extended periods of time similar to the first material and will trigger re-emission of visible light of about 500 nanometers upon application of an infrared source. The emission spectrum under IR stimulation is illustrated in FIG. 4.

EXAMPLE 3

A photoluminescent material is made according to the ingredients and the process of Example 2 above except that the mixture is heated for 2 hours in the fusing step. The output spectrum of this photoluminescent material will be essentially the same as FIG. 4, but this material is different from Example 2 in that the extended fusing step extends the infrared sensitivity to higher wavelengths.

EXAMPLE 4

A photoluminescent material is made having the following composition:

| | |
|---|---|
| Strontium sulfide | 100 parts |
| Barium sulfate | 5.5 parts |
| Samarium | 150 parts per million |
| Europium oxide | 550 parts per million |

The listed materials (within ranges specified for Example 1 above) are deposited upon a substrate of aluminum oxide by any known technique including physical deposition (evaporation, sputtering, etc.) or chemical vapor deposition, gaseous diffusion, ion beam deposition, molecular beam deposition, and electron beam deposition. The materials and substrate are placed into a furnace for fusing under the conditions of Example 1. The material fuses without the use of the lithium fluoride of Example 1. Because the photoluminescent material bonds so well to the aluminum oxide substrate, the use of separate binders or vehicles is unnecessary.

The structure resulting from the fusing step may optionally be encapsulated in clear plastic to realize the device 10 of FIG. 3. No grinding or reheating is necessary. The process of Example 4 may be applied to an aluminum oxide disc to provide an optical memory which could likewise be coated by clear plastic.

The process of Example 4 could be used with the starting materials of Examples 2 and 3 except that lithium fluoride would not be used. The fusing step could be accomplished under the conditions of Example 2 or Example 3. As with Examples 1, 2, and 3, the use of barium sulfate is not absolutely essential but greatly improves the optical characteristics of the material.

The substrate for Example 4 could be aluminum oxide in the form of sapphire or ruby in which case the layer of optical material could be as thin as 0.5 microns to form a very high quality memory.

The optical materials of the present invention may be used for IR sensing and/or memory by their electron trapping characteristics in crystal form (i.e., the form in Examples 1, 2, and 3 before grinding), powder form (Examples 1, 2, and 3), and amorphous form (Example 4).

Turning now to FIG. 4, a memory system 10 according to the present invention will be described in detail.

The memory system 10 uses an optical memory 12 having a plastic substrate 14 and one of the memory materials described in detail above. The optical memory material 16 is adhered to the substrate 14 by use of a binder and the process described above.

A read-write head 18 is used for writing data upon the electron trapping material 16 and for reading data from the electron trapping material 16. More specifically, read-write head 18 includes a writing source of optical energy such as a visible light laser 20, a read source of electromagnetic energy such as an infrared laser 22, an amplitude modulator 24 for varying the intensity of the output of laser 22, and a sensor 26. A beam splitting mirror 28 and a dichroic mirror 30 are used to insure proper orientation of the light beams used in the optical system. As an alternative to the sensor 26 placed within the read-write head 18, a sensor 26A may be disposed on a side of the memory 12 opposite the side upon which read-write head 18 is disposed.

The read-write head 18 may be movably mounted to access various storage locations within the optical memory 12. More specifically, the head 18 may be movable under control of a motor and drive 32 which serve as an addresser in that they control the address upon which beams from the lasers are directed. The motor and drive 32 used to move the housing in which the read-write head 18 is disposed and is controlled by the address register 34. The memory 12 could be a rotatable disc and the head 18 would be movable radially and operable to activate read-write operations when the disc is in a particular part of its rotation corresponding to the desired memory location becoming in line with the read or write laser beam. The head 18 may be connected and mounted for movement relative to the optical memory 12 in similar fashion to the mounting of a head for a compact disc unit, also know as a laser disk unit. As this type of connection is well known, it is unnecessary to describe the specific details thereof.

The operation of the embodiment of FIG. 4 will now be described. Data may be written upon the memory medium material 16 of optical memory 12 by activation of the visible light source such as (although the sources are all shown as lasers, the present invention advantageously does not require lasers and LEDs could be used instead) laser 20. In particular, the laser 20 outputs a light beam 36 which passes through the beam splitter 28 and the dichroic filter 30 and will energize a particular storage location in optical memory 12 with visible light. That is, the laser 20 will cause electron trapping at the storage location upon which the beam 36 is directed, this storage location being determined by the output of the address register 34. The output of address register 34 controls the motor and drive 32 to move the head 18 to the proper location corresponding to the address within register 34.

When it is desired to read a particular address within the optical memory 12, the address is fed into the address register 34 and the motor and drive 32 move head 18 to an appropriate position such that the output of the read infrared laser 22 will be directed upon the proper location. The output of laser 22 is a beam 38 which is modulated by amplitude modulation 24 for reasons discussed in detail below. After modulation, the beam 38 hits the dichroic filter 30 and is reflected by the dichroic filter or "hot mirror". The filter 30 reflects infrared, but allows ready passage of visible light. Upon the infrared beam from laser 22 hitting a storage location within optical memory 12, the optical material 16 will output a visible light corresponding to the freeing or releasing of some trapped electrons provided that the location has previously been energized by the write laser 20. The visible light output corresponding to the read beam will pass readily through filter 30 and is directed by beam splitter 28 to sensor 26 which may thereby read the data within the particular storage location. If no visible light is sensed, the address which has been accessed will be read as a zero. On the other hand, if the write laser 20 has previously written in the storage location which is being addressed, the sensor 26 will indicate the presence of a visible light beam corresponding to a 1 in that storage location. The sensor 26 may be a photo multiplier, photo transistor, or any of numerous optical sensing devices.

For the alternate arrangement where the sensor 26A is used in place of sensor 26, the visible light from optical memory 12 passes through the substrate 14 and falls upon the sensor 26A whereupon it may be processed.

The sensors 26 or 26A may be connected to a computer in known fashion as the address register 34 will also be connected in known fashion to a computer. Therefore, it is unnecessary to describe the details of the connections between these components and the computer. Of course, one or more buffer registers or other elements may be connected between the sensor 26 or sensor 26A and the computer.

The head 18 may be connected and mounted for movement relative to the optical memory 12 in similar fashion to the mounting of a head for a compact disk unit, also known as a laser disk unit. As this type of connection is well known, it is unnecessary to describe the specific details thereof.

When reading the optical memory 12, the infrared beam from laser 22 will be sufficiently antenuated by the amplitude modulator 24 that it will only release some of the trapped electrons from the particular storage location. Because the optical material 16 is sufficiently dense in trapped electrons, the beam will not release all of the electrons. Therefore, a particular storage location which has been set or written in by the laser 20 will retain its data over numerous readings, thereby minimizing the need for refresh circuitry. When it is desired to erase the data within a particular memory location or to write a zero in the memory, the read source infrared laser 22 may be applied full strength to the storage location such that virtually all of the electrons trapped therein will be released, thereby setting the storage location back to 0. (Thus, the laser 22 may serve as a write source when writing zero and as a read source when applied at a lower strength.) In order to apply the laser 22 full strength to the optical memory 12, the amplitude modulator will be set for minimum or no modulation or antenuation.

The above discussion assumes that the optical memory being in a charged (i.e., having trapped electrons) state corresponds to a logical "one". However, the optical memory 12 could alternately be arranged such that the presence of trapped electrons indicates a logical zero (0) as the particular logic (positive or negative) is arbitrary.

Figure 5:
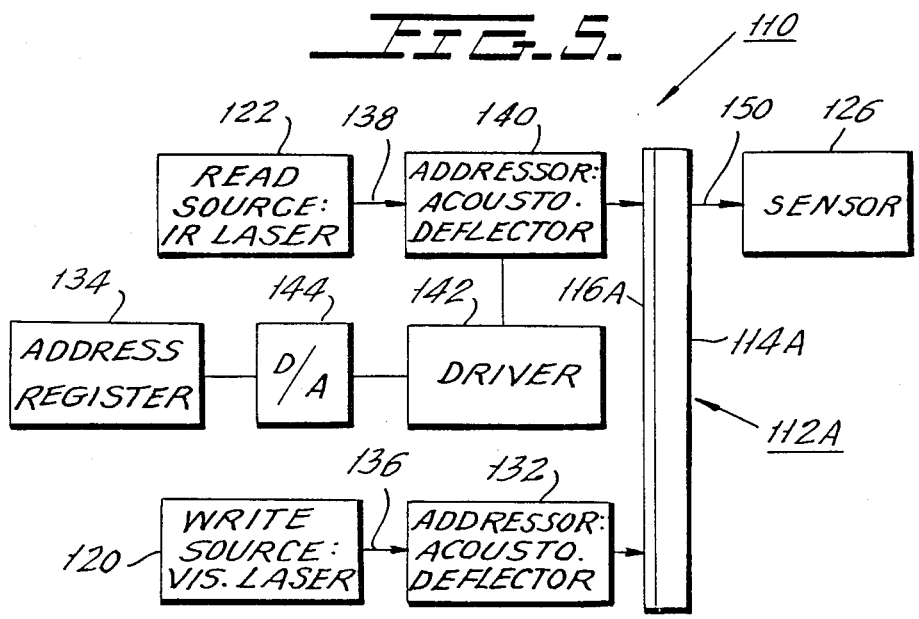
FIG. 5 shows a simplified schematic of a second memory arrangement according to the present invention.

Turning now to FIG. 5, an alternate arrangement memory system 110 is shown. As the memory system 110 includes several components which are identical or substantially similar to components of the system 10 of FIG. 4, the components of FIG. 5 have been numbered with the same last two (2) digits in the "100" series as the corresponding component.

The system 110 includes a write source 120, an acousto optic deflector serving as an addresser 132, a read source 122, a separate read source addresser acousto optic deflector 140, a driver 142, a digital to analog converter 144, and an address register 134. An optical memory 112A is constructed identically to the optical memory 12 of FIG. 4. The memory of FIG. 5 includes an optical coating of the electron trapping material 116A and corresponding substrate 114A.

A sensor 126 is disposed upon a side of the memory opposite the side upon which the read source and write source are disposed.

In order to write in the memory system shown in FIG. 5, the visible light laser 120 outputs a beam 136 which is fed into the acousto-optic deflector 132 whereupon it may be deflected at a variable angle corresponding to the appropriate address. The address may be determined by an address register feeding a digital to analog converter and a driver such as the arrangement shown immediately above for the acousto-optic deflector 140. The arrangement of FIG. 5 shows the visible laser 120 as able to write upon the first memory 112A.

When it is desired to access data within the memory 112A the infrared laser 122 is controlled by acousto-optic deflector 140 to access a storage location corresponding to a setting in the address register 134. The output of the address register 134 is converted to an analog signal controlling a driver 142. The driver 142 may preferably may be a voltage to frequency converter or voltage control oscillator and its output will be a frequency depending upon the desired address. The output of driver 142 will control the angle of deflection of the deflector 140 such that it accesses the address for which reading of data is desired. A galvanometer-type deflector could be used in place of the acousto-optic deflector 140.

The output of read source infrared laser 122 could optionally be modulated by an amplitude modulation device similar to 24 in FIG. 4 so as to provide erasing of data and programming storage locations to zero (0).

Upon the beam 138 being directed to the proper address by the acousto-optic deflector 140, it causes the emission of light from the optical memory 112A provided that the storage location has previously been set to 1. The output light from the memory 112A, if any, will then be transmitted through the plastic substrate as light 150.

Figure 6:
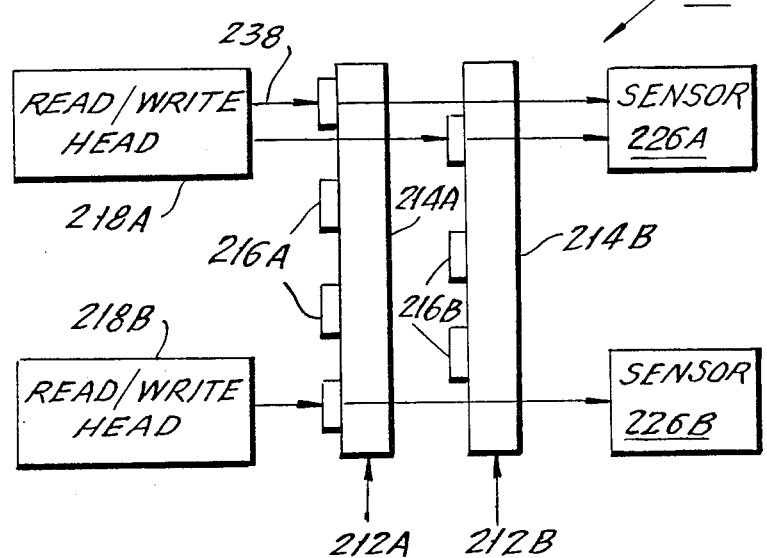
FIG. 6 shows a third embodiment memory arrangement according to the present invention.

FIG. 6 shows an alternate optical memory system 210 wherein components are labeled with the same last two (2) digits and in the 200 series as the corresponding components in the embodiment of FIG. 4. The arrangement of FIG. 6 shows a plurality of read-write heads 218A and 218B which may be used for parallel access in combination with sensors 226A and 226B. An address register and motor and drive would be used for each of the heads 218A and 218B, but these have been not illustrated for simplicity purposes.

FIG. 6 has also illustrated schematically an arrangement for taking a logical or Boolean "OR" function. Specifically, two (2) memories 212A and 212B are arranged in parallel, each memory having corresponding alternating stripes of memory material 216A and 216B. The alternating stripes 216A and 216B allow one to access two (2) memory locations, one memory location on 212A and the other on memory 212B, with a single read beam 238. For explanation purposes, the beam 238 is shown as two (2) beams at the top of FIG. 6. However, in reality it may be a single beam of sufficient width that it strikes upon a memory location on the stripe of memory material 216A on memory 212A and a portion of the beam strikes a part of memory 212A which is not covered by memory material. That later portion simply passes through the clear plastic and strikes a portion of one of the memory material stripes 216B. Accordingly, the beam 238 and read-write head 218A may be used to read two (2) memory locations simultaneously with the output to sensor 226A being a logical "OR" function. If either of the two (2) memory locations has been set to logical 1, the sensor 226A will detect the light and output a positive signal for use by the other computer circuitry. A simpler version of this could take an "or" function by simultaneously accessing two (2) storage cells upon a single memory such that the sensor would sense visible light if either memory location is storing a "one". An alternate version of the two memory arrangement of FIG. 6 could use a sensor 226A which has three output levels: a "zero" corresponding to both memory cells being low, a "one" corresponding to only one of the memory cells being high, and a "two" corresponding to both cells being high. By detecting the "two", one can realize a logical "AND" operation.

Figure 7:
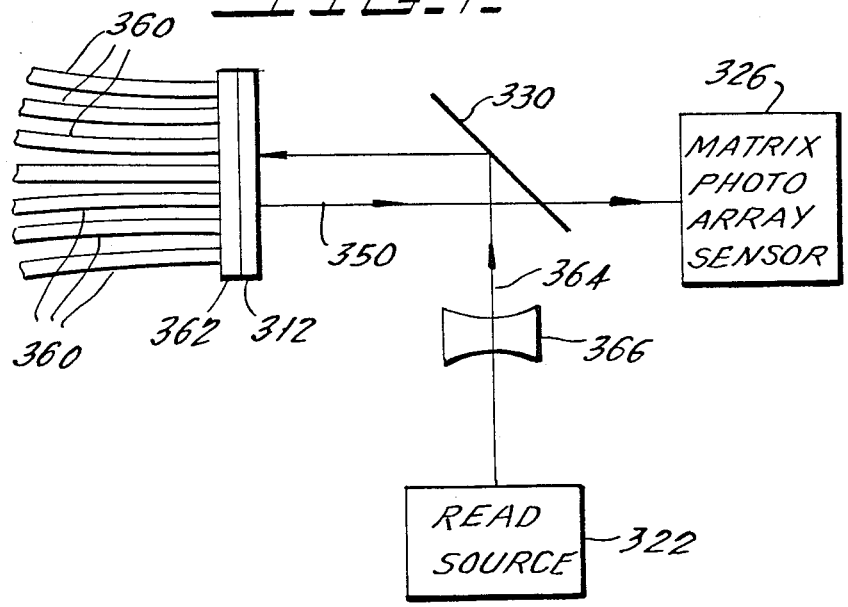
FIG. 7 shows a fourth memory arrangement according to the present invention.

FIG. 7 shows a parallel read/write memory wherein write light is supplied on optical fibers 360 supplied on the fibers 360 if desired. The memory 312 is made of a memory material (from one of the above examples) directly bonded or coated upon a fiber optic interface plate 362 corresponding to the junction of the fibers 360 such that parallel write (and, optionally, read and/or erase) may be made through the optical fibers 360. The output of memory 312 is light 350 such that all locations of memory 312 can be read in parallel by photo array sensor 326 when stimulating IR 364 is applied by read source 322 through diverging lens 366 and reflected by dichroic filter 330. One or more lenses could be used between the memory 312 and sensor 326 for focusing the output light 350. The locations (one or more memory cells) of memory 312 would be addressed by supplying optical radication (for write, read, and/or erase) through fibers 360 and/or supplying optical radiation (for write, read, and/or erase) through lens 366.

Although the present invention has been illustrated by various specific materials, constructions, and arrangements, it is to be understood that these are for illustrative purposes only. Various modifications and adaptations may be made by those of skill in the art. Accordingly, the particulars of the invention should be determined by reference to the claims appended hereto.

What is claimed is:

1. A method for storing and retrieving data, comprising the steps of:
    a. writing said data at a location in a first optical memory formed of electron trapping phosphor by:
        (i) addressing said location; and
        (ii) applying write optical energy comprising visible light of a first wavelength to said memory at said location to input said data, whereby electrons in said phosphor are trapped at an elevated energy level at said location; and
    b. reading said data at said location by:
        (i) addressing said location; and
        (ii) applying read optical energy of a second wavelength greater than said first wavelength to said location to release a portion of the trapped electrons at said location and cause photon emission from the released electrons; and (iii) sensing emitted optical energy corresponding to a photon emission, whereby the stored data may be read in a substantially non-destructive manner;

wherein said electron trapping phosphor is formed as a vapor deposited thin film on a substrate by a technique selected from the group of vapor depositing techniques including evaporation, sputtering, chemical vapor deposition, ion beam deposition, and molecular beam deposition, whereby a fine storage resolution is obtained.

2. The method of claim 1, further comprising the step of erasing data in said location by:

(i) addressing said location; and
(ii) applying erase optical energy to said location to release substantially all trapped electrons at said location.

3. The method of claim 2 wherein said erase optical energy is of a higher power and substantially the same wavelength as said read optical energy.

4. The method of claim 1 wherein said read optical energy is infrared and said emitted optical energy is visible light.

5. The method of claim 1 wherein said write optical energy is applied by a laser and said read optical energy is applied by a laser.

6. The method of claim 1 wherein said read optical energy is applied by a laser from a first side of said memory and said emitted optical energy is sensed from a second side of said memory, opposite said first side.

7. The method of claim 1 wherein a plurality of data bits are simultaneously written into said first memory.

8. The method of claim 1, wherein said electron trapping phosphor comprises a mixture of:

a base material selected from the group of alkaline earth metal sulfides and selenides for forming a host crystal; and from 50 to 300 parts per million by weight of samarium as a first dopant, whereby the phosphor attains its electron trapping characteristic.

9. The method of claim 8, wherein said electron trapping phosphor further comprises:

a europium compound selected from the group of: europium oxide, europium floride, europium chloride, and europium sulfide, there being from 300 to 800 parts per million, by weight of the europium compound as a second dopant.

10. The method of claim 8, wherein said electron trapping phosphor further comprises:

from 300 to 1500 parts per million by weight of cerium oxide as a second dopant; and wherein there is from 50 to 200 parts per million by weight of samarium in said electron trapping phosphor.

11. The method of claim 8 wherein said memory medium further comprises:

from 1 to 5% barium sulfate by weight.

12. A method, as described in claim 1, wherein first data is written at a first location and second data is simultaneously read from another location.

13. A method, as described in claim 1, additionally comprising the steps of simultaneously reading and writing additional data at other locations in said first optical memory.

14. A method, as described in claim 1, wherein a second optical memory formed of electron trapping phosphor is provided, said method additionally comprising the steps of simultaneously reading data at a location on said first memory and data at a location on said second memory by simultaneously applying read optical energy to both said locations to release a portion of the trapped electrons at said locations and cause photon emission from the released electrons and sensing the combined emitted optical energy, whereby logical "OR" and "AND" functions may be performed.

15. The method of claim 1, wherein said write optical energy and read optical energy are applied as directed beams of optical energy.

16. The method of claim 1, wherein said thin film of electron trapping phosphor is formed as thin as 0.5 microns.

17. A data storage apparatus comprising:

a. a first optical memory formed of an electron trapping phosphor having a plurality of storage locations;

b. an addressing means for selecting storage locations in said first memory;

c. a first source of optical energy for applying write optical energy comprising visible light of a first wavelength to a storage location selected by said addressing means, whereby electrons in said phosphor are trapped at an elevated energy level at said location and data is stored;

d. a first source of optical energy for applying a controlled amount of read optical energy of a second wavelength greater than said first wavelength to a storage location selected by said addressing means, whereby a portion of the trapped electrons at said location are released, resulting in photon emission from the released electrons; and e. a sensor for sensing emitted optical energy corresponding to the photon emission from said location, whereby stored data is read in a substantially non-destructive manner;

wherein the electron trapping phosphor is formed as a vapor deposited thin film on a substrate by a technique selected from the group of vapor depositing techniques including evaporation, sputtering, chemical vapor deposition, ion beam deposition, and molecular beam deposition, whereby a fine storage resolution is obtained.

18. The apparatus of claim 17 further comprising an address register connected to supply said addressing means with a selected address.

19. The apparatus of claim 17, wherein said first and second sources of optical energy are mounted upon a head movable relative to said first memory.

20. The apparatus of claim 17, wherein said addressing means comprises first and second deflectors operable to direct beams of optical energy from said first and second sources on different storage locations of said first memory.

21. The apparatus of claim 17, wherein said second source is further operable to apply erase optical energy to an addressed location to release substantially all trapped electrons at said location.

22. The apparatus of claim 17 wherein said first source is a visible light laser and said second source is an infrared laser.

23. The invention of claim 17 wherein said sources and said sensor are on opposite sides of said first memory.

24. The apparatus of claim 17 further comprising a second memory formed of an electron trapping phosphor having a plurality of storage locations and disposed for simultaneous application of optical energy to said first memory and said second memory and wherein said sensor senses optical energy from said first and said second memories and wherein an output of said sensor depends upon a logical function of data in said first and second memories.

25. The apparatus of claim 17, wherein said electron trapping phosphor comprises a mixture of a base material selected from the group of alkaline earth metal sulfides and selenides for forming a host crystal; and from 50 to 300 parts per million by weight of samarium as a first dopant, whereby the phosphor attains its electron trapping characteristics.

26. The apparatus of claim 25, wherein said electron trapping phosphor further comprises:
a europium compound selected from the group of: europium oxide, europium floride, europium chloride, and europium sulfide, there being from 300 to 800 parts per million by weight of the europium compound as a second dopant.

27. The apparatus of claim 25, wherein said electron trapping phosphor further comprises:
from 300 to 1500 parts per million by weight of cerium oxide as a second dopant.

28. The apparatus of claim 22 wherein said electron trapping phosphor further comprises:
from 1% to 5% barium sulfate by weight.

29. A data storage apparatus, as described in claim 17, additionally comprising means for modulating the read optical energy, whereby a storage location can be subjected to increased read optical energy causing the release of substantially all trapped electrons at said location, thereby erasing any data stored at said location.

30. A data storage apparatus, as described in claim 17, wherein said first and second sources of optical energy provide directed beams of optical energy.

31. The method of claim 17, wherein said thin film of electron trapping phosphor is formed as thin as 0.5 microns.

32. A data storage apparatus comprising:
an optical memory medium formed of an electron trapping phosphor including a mixture of a base material selected from the group of alkaline earth metal sulfides and selenides forming a host crystal and from 50 to 300 parts per million by weight of samarium as a first dopant; and
a substrate of aluminum oxide having said memory medium mounted thereon;
wherein the electron trapping phosphor is formed as a vapor deposited thin film on said aluminum oxide substrate by a technique selected from the group of vapor depositing techniques including evaporation, sputtering, chemical vapor deposition, ion beam deposition, and molecular beam deposition, whereby a fine storage resolution is obtained.

33. The apparatus of claim 32, further comprising:
a. an addressing means for selecting storage locations in said memory medium;
b. a first source of optical energy for applying write optical energy to a storage location selected by said addressing means, whereby electrons in said phosphor are trapped at an elevated energy level at said location and data is stored;
c. a second source of optical energy for applying a controlled amount of read optical energy to a storage location selected by said addressing means, whereby a portion of the trapped electrons at said location are released resulting in photon emission from the released electrons; and
d. a sensor for sensing emitted optical energy corresponding to the photon emission from said location, whereby stored data is read in a substantially non-destructive manner.

34. A data storage apparatus, as described in claim 32, wherein said electron trapping phosphor additionally comprises:
a europium compound selected from the group of: europium oxide, europium floride, europium chloride, and europium sulfide, there being from 300 to 800 parts per million by weight of the europium compound as a second dopant.

35. The apparatus of claim 33, additionally comprising means for modulating the read optical energy, whereby a storage location can be subjected to increased read optical energy causing the release of substantially all trapped electrons at said location, thereby erasing any data stored at said location.

36. The method of claim 32, wherein said thin film of electron trapping phosphor is formed as thin as 0.5 microns.

* * * * *